United States Patent
Lim et al.

(10) Patent No.: US 11,112,461 B2
(45) Date of Patent: Sep. 7, 2021

(54) METHOD FOR ESTIMATING STATE OF CHARGE OF ENERGY STORAGE DEVICE

(71) Applicant: LG CHEM, LTD., Seoul (KR)

(72) Inventors: Bo Mi Lim, Daejeon (KR); Won Tae Joe, Gyeonggi-do (KR)

(73) Assignee: LG CHEM, LTD., Seoul (KR)

( * ) Notice: Subject to any disclaimer, the term of this patent is extended or adjusted under 35 U.S.C. 154(b) by 203 days.

(21) Appl. No.: 16/469,292

(22) PCT Filed: Jan. 23, 2018

(86) PCT No.: PCT/KR2018/001026
§ 371 (c)(1),
(2) Date: Jun. 13, 2019

(87) PCT Pub. No.: WO2018/151431
PCT Pub. Date: Aug. 23, 2018

(65) Prior Publication Data
US 2020/0003844 A1    Jan. 2, 2020

(30) Foreign Application Priority Data
Feb. 17, 2017 (KR) .................. 10-2017-0021399

(51) Int. Cl.
*H02J 7/00* (2006.01)
*G01R 31/3842* (2019.01)
*H02J 7/04* (2006.01)

(52) U.S. Cl.
CPC ........ *G01R 31/3842* (2019.01); *H02J 7/0063* (2013.01); *H02J 7/007192* (2020.01); *H02J 7/045* (2013.01); *H02J 2007/0067* (2013.01)

(58) Field of Classification Search
CPC .................................................. G01R 31/3842
USPC ............................................................ 320/132
See application file for complete search history.

(56) References Cited

U.S. PATENT DOCUMENTS

| | | | |
|---|---|---|---|
| 2010/0280777 A1 | 11/2010 | Jin et al. | |
| 2013/0335031 A1* | 12/2013 | Joe | H02J 7/007 320/134 |
| 2015/0134282 A1 | 5/2015 | Soga et al. | |
| 2015/0137822 A1* | 5/2015 | Joe | H01M 10/48 324/426 |
| 2018/0090962 A1* | 3/2018 | Cha | G01R 31/3842 |
| 2019/0346511 A1* | 11/2019 | Lim | G01R 31/3842 |

FOREIGN PATENT DOCUMENTS

| | | |
|---|---|---|
| JP | 2006-38495 A | 2/2006 |
| JP | 2009-257775 A | 11/2009 |
| JP | 2012-225713 A | 11/2012 |
| JP | 2013-217899 A | 10/2013 |
| JP | 2013-250234 A | 12/2013 |
| JP | 2014-182072 A | 9/2014 |

(Continued)

OTHER PUBLICATIONS

International Search Report (PCT/ISA/210) issued in PCT/KR2018/001026, dated May 29, 2018.

*Primary Examiner* — Yalkew Fantu
(74) *Attorney, Agent, or Firm* — Birch, Stewart, Kolasch & Birch, LLP

(57) ABSTRACT

A method for estimating a state of charge of an energy storage system using a voltage modeling technique in which different parameters are used according to a charge/discharge state.

15 Claims, 4 Drawing Sheets

(56) References Cited

FOREIGN PATENT DOCUMENTS

| | | |
|---|---|---|
| KR | 10-2009-0077657 A | 7/2009 |
| KR | 10-2012-0046355 A | 5/2012 |
| KR | 10-1227417 B1 | 1/2013 |
| KR | 10-2013-0142807 A | 12/2013 |
| KR | 10-1394012 * | 12/2013 |
| KR | 10-1394012 B1 | 5/2014 |
| KR | 10-2014-0093552 A | 7/2014 |
| KR | 10-2016-0046549 A | 4/2016 |

* cited by examiner

【Fig. 1】
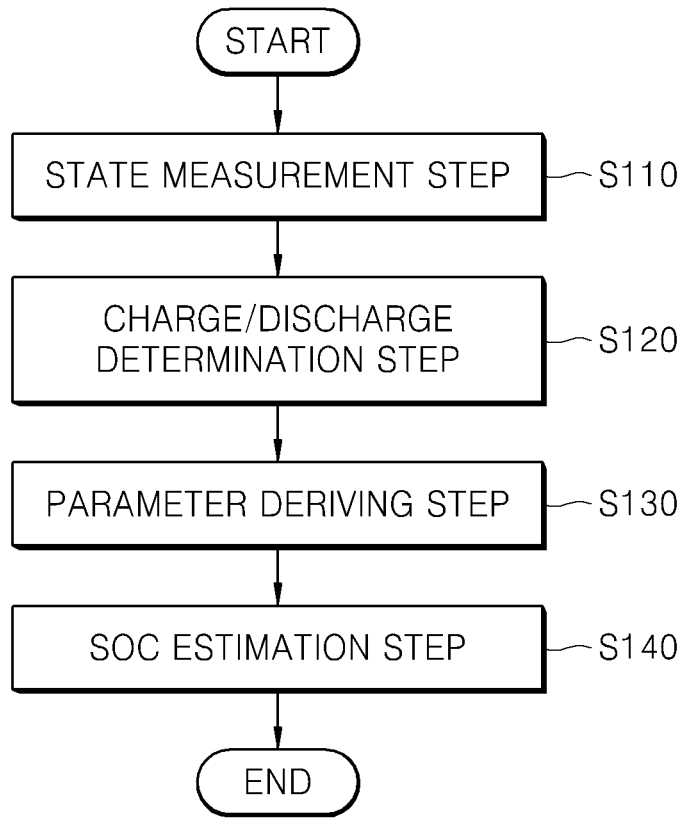
【Fig. 2】
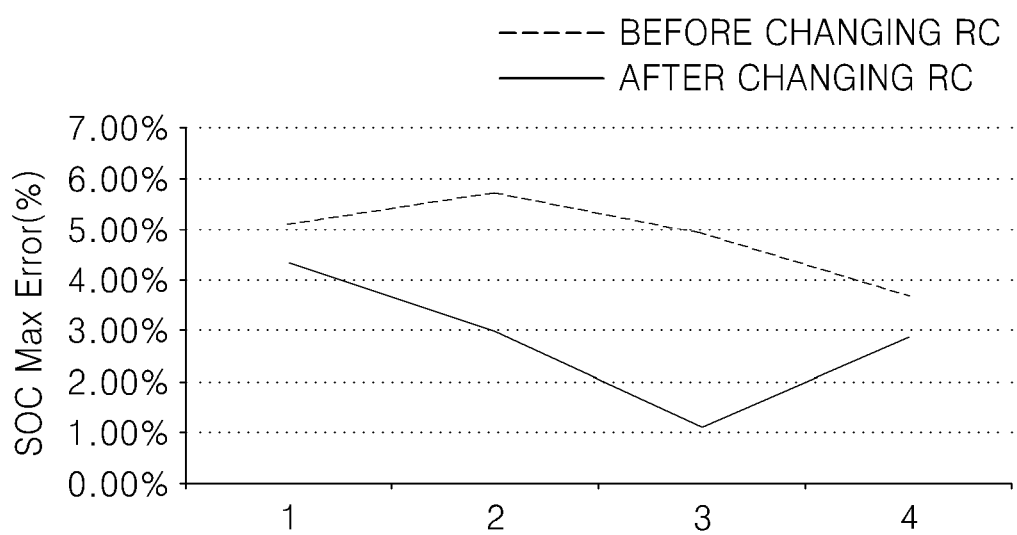

[Fig. 3]
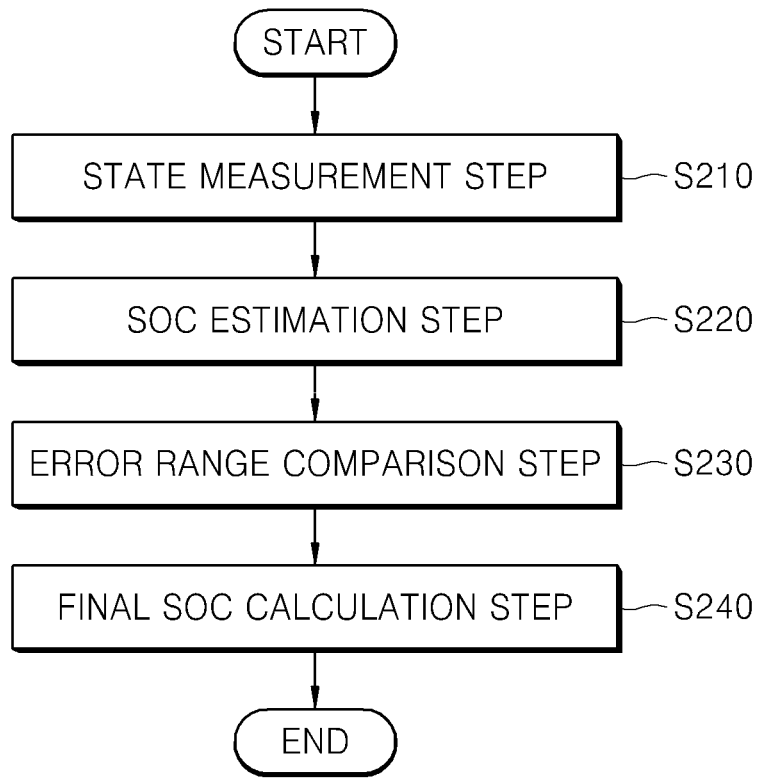
[Fig. 4]
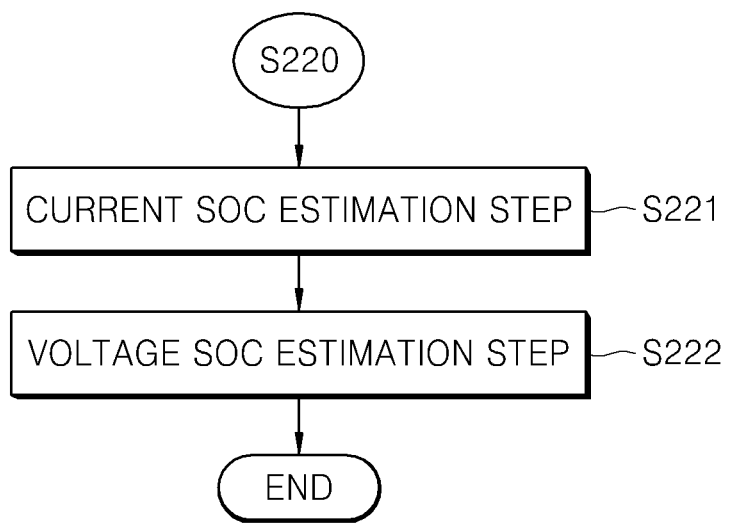

[Fig. 5]
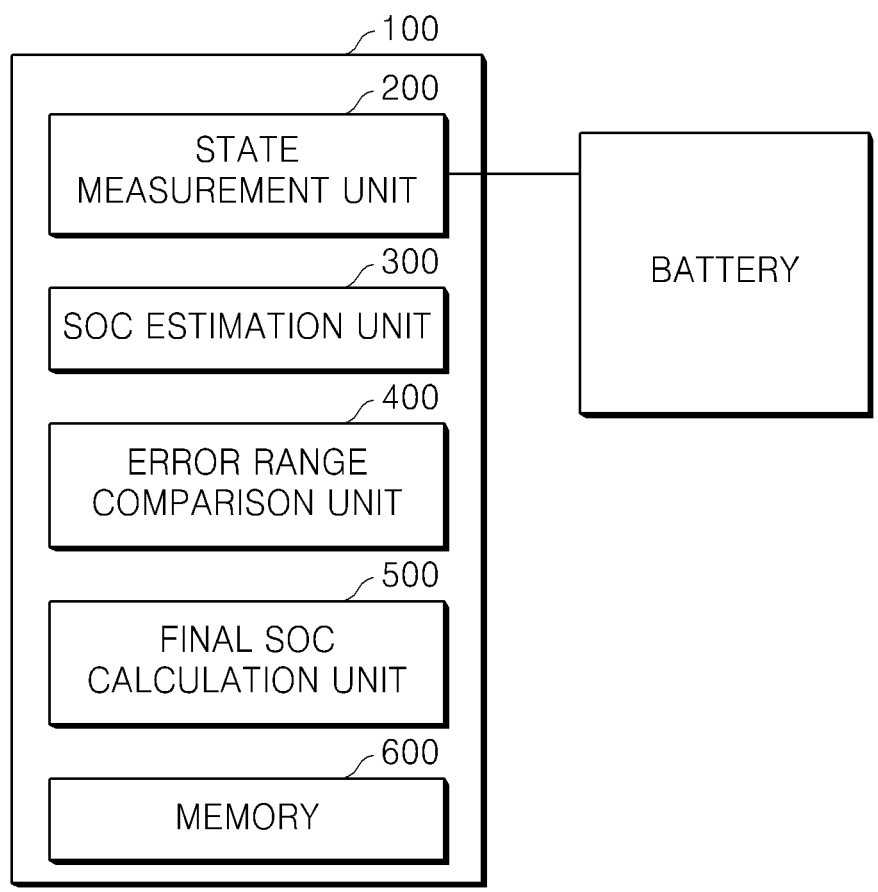

[Fig. 6]
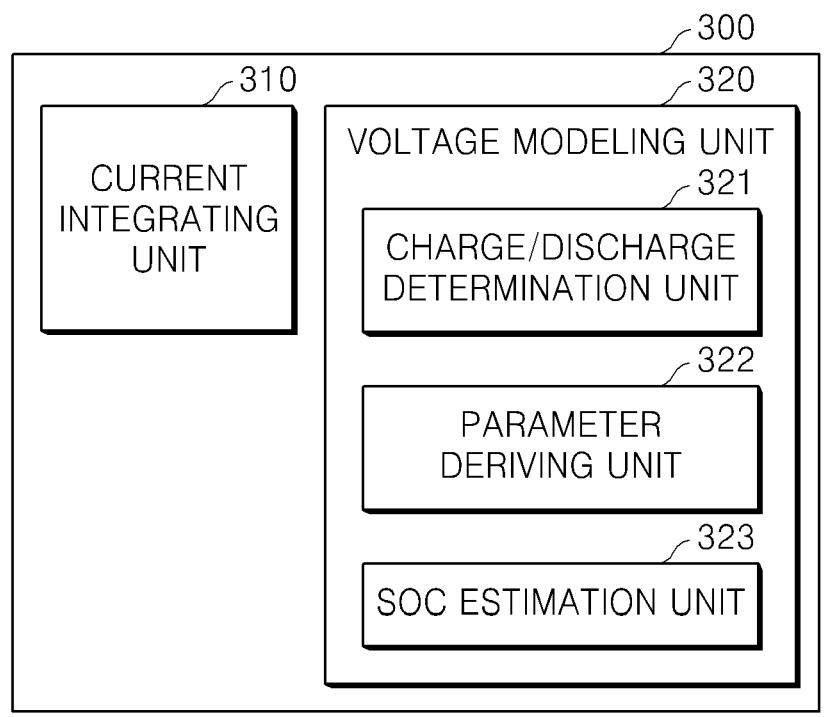

METHOD FOR ESTIMATING STATE OF CHARGE OF ENERGY STORAGE DEVICE

TECHNICAL FIELD

The present invention relates to a method for estimating a state of charge of an energy storage system, and more particularly, to a method for estimating an accurate state of charge of an energy storage system using different state-of-charge (SOC) parameters according to a charge/discharge state when using a voltage modeling technique.

The present application claims priority under 35 U.S.C. § 119(a) to Korean Patent Application No. 10-2017-0021399 filed on Feb. 17, 2017 in the Republic of Korea, the disclosure of which is hereby incorporated by reference in its entirety.

BACKGROUND ART

With the development of industry, the demand for electric power is increasing, and the differences in electric power consumption between day and night, between seasons, and between days are increasing. For this reason, various technologies have been recently developed to reduce a peak load using surplus power of a system.

A representative technology among these technologies is an energy storage system (ESS) which stores surplus power of a system in a battery or supplies insufficient power of the system from the battery.

Furthermore, the ESS is provided with a plurality of batteries. Here, a typical battery includes a battery management system (BMS) therein to efficiently control a charging or discharging operation of the battery.

To increase the life of a battery and safely use the battery, the battery should be driven within an appropriate charging range of the battery, and the life of the battery significantly changes according to the number of times of charging/discharging.

Therefore, it is important to detect a state of a battery by accurately estimating the state-of-charge (SOC) by measuring a current, voltage, and temperature of the battery through the BMS.

Methods for estimating the state-of-charge (SOC) may be roughly classified into four categories: a current integrating method for integrating charge/discharge currents; a electrochemical model technique for representing chemical reaction inside a cell in molecular units; a mathematical technique for expressing dynamic behavior of the state-of-charge (SOC) and operation time of a battery in pure mathematical empirical formulas and a voltage modeling technique using a relationship between the state-of-charge (SOC) and an open circuit voltage (OCV).

Meanwhile, the electrochemical model technique is vulnerable to a temperature change, and according to the mathematical technique, an algorithm used in a BMS is complicated, causing an increase of production cost.

Therefore, the current integrating method and the voltage modeling technique are used in combination to estimate the state-of-charge (SOC) of a typical ESS. However, since the accuracy of the voltage modeling technique decreases at the time of charging/discharging, the degree of dependence on the current integrating method is higher than the degree of dependence on the voltage modeling technique.

However, according to the current integrating method, since charging/discharging currents are accumulated using an integrator, an initial value is inaccurate and an error of a value of current accumulation by a current sensor, which has a high error ratio when used for a long time, increases significantly.

Furthermore, when a state of health (SOH) is measured on the basis of the state of charge (SOC) estimated through the current integrating method in order to estimate the state of health (SOH) to predict a battery life, a capacitance cannot be accurately estimated relative to a capacitance change due to battery cell deterioration caused by the above-mentioned inaccurate initial value and increase of the error of the value of current accumulation by the current sensor.

Thus, it is required to develop a technology for accurately estimating the state of charge (SOC) of the ESS even when the ESS is used for a long time.

PRIOR ART DOCUMENT

Patent Document (Patent Document 1) KR1227417 B

DISCLOSURE OF THE INVENTION

Technical Problem

The prevent invention provides an energy storage system charge state estimating method for improving the accuracy of an energy storage system charge state estimated using a voltage modeling technique.

Technical Solution

A method for estimating a state of charge (SOC) of an energy storage system (ESS) according to an embodiment of the present invention includes: a first step of measuring a current, voltage, and temperature of the energy storage system; a second step of determining a charge/discharge state on the basis of the current and voltage measured in the first step; a third step of deriving a state-of-charge (SOC) parameter according to the charge state or discharge state determined in the second step; and a fourth step of estimating the state of charge (SOC) of the energy storage system on the basis of the state-of-charge (SOC) parameter derived in the third step.

The first step to the fourth step may be repeated at a predetermined estimation period.

In the third step of deriving the state-of-charge (SOC) parameter, the state-of-charge (SOC) parameter may be derived on the basis of the temperature measured in the first step and the state of charge (SOC) estimated during a previous estimation period.

When the predetermined estimation period is a first estimation period, the state of charge (SOC) is estimated using a current integrating method and a previously estimated state of charge (SOC) is set to the state of charge (SOC) estimated during the previous estimation period.

The predetermined estimation period may be changed according to the state of charge (SOC).

A method for estimating a state of charge (SOC) of an energy storage system (ESS) according to a second embodiment of the present invention includes: a state measurement step of measuring a current, voltage, and temperature of the energy storage system; a state-of-charge (SOC) estimation step of estimating states of charge (SOCs) respectively based on a current integrating method and a voltage modeling technique by applying the current, voltage, and temperature measured in the state measurement step to the current integrating method and the voltage modeling technique; an error range comparison step of comparing a difference between the state of charge of the current integrating method and the state of charge of the voltage modeling technique estimated in the state-of-charge (SOC) estimation step to determine whether the difference exceeds a predetermined error range; and a final state-of-charge (SOC) calculation step of calculating, when the difference between the state of charge (SOC) of the current integrating method and the state of charge (SOC) of the voltage modeling technique exceeds the predetermined error range in the error range comparison step, a final state of charge (SOC) by applying a predetermined weight to the state of charge of the current integrating method and the state of charge of the voltage modeling technique.

The state-of-charge (SOC) estimation step may include: a current state-of-charge (SOC) estimation step of estimating the state of charge (SOC) of the energy storage system by applying the current measured in the state measurement step to the current integrating method; and a voltage state-of-charge (SOC) estimation step of estimating the state of charge (SOC) of the energy storage system by applying the current, voltage, and temperature measured in the state measurement step to the voltage modeling technique.

The error range comparison step may include an estimation number-of-times comparison step of comparing the current state-of-charge (SOC) estimation step with a predetermined number of times of estimation to determine whether the current state-of-charge (SOC) estimation step exceeds the predetermined number of times of estimation, wherein when the current state-of-charge (SOC) estimation step exceeds the predetermined number of times of estimation, the final state-of-charge (SOC) calculation step may be performed.

A device for estimating a state of charge (SOC) of an energy storage system (ESS) according to an embodiment of the present invention includes: a state measurement unit configured to measure a current, voltage, and temperature of the energy storage system; a state-of-charge (SOC) estimation unit configured to estimate states of charge (SOCs) respectively based on a current integrating method and a voltage modeling technique by applying the current, voltage, and temperature measured in the state measurement unit to the current integrating method and the voltage modeling technique; an error range comparison unit configured to compare a difference between the state of charge (SOC) of the current integrating method and the state of charge (SOC) of the voltage modeling technique estimated in the state-of-charge (SOC) estimation unit to determine whether the difference exceeds a predetermined error range; a final state-of-charge (SOC) calculation unit configured to calculate, when the difference between the state of charge of the current integrating method and the state of charge of the voltage modeling technique is determined to exceed the predetermined error range in the error range comparison unit, a final state of charge (SOC) by applying a predetermined weight to the state of charge of the current integrating method and the state of charge of the voltage modeling technique; and a memory configured to store each state of charge (SOC) estimated in the state-of-charge (SOC) estimation unit.

The state-of-charge (SOC) estimation unit may include: a current integrating unit configured to estimate the state of charge (SOC) of the energy storage system by applying the current measured in the state measurement unit to the current integrating method; and a voltage modeling unit configured to estimate the state of charge (SOC) of the energy storage system by applying the current, voltage, and temperature measured in the state measurement unit to the voltage modeling technique.

The voltage modeling unit may include: a charge/discharge determination unit configured to determine whether a current state is a charge state or a discharge state on the basis of the current and voltage measured in the state measurement unit; a parameter deriving unit configured to derive a state-of-charge (SOC) parameter on the basis of a state determined in the charge/discharge determination unit; and a voltage state-of-charge (SOC) estimation unit configured to estimate the state of charge (SOC) of the energy storage system (ESS) on the basis of the state-of-charge (SOC) parameter derived in the parameter deriving unit.

The parameter deriving unit may derive the state-of-charge (SOC) parameter on the basis of the temperature measured in the state measurement unit and the state of charge (SOC) stored in the memory and estimated during a previous estimation period.

The error range comparison unit may further include an estimation number-of-times comparison unit configured to compare the number of state-of-charge (SOC) estimations performed by the current integrating unit with a predetermined number of times of estimation to determine whether the number of state-of-charge (SOC) estimations exceeds the predetermined number of times of estimation.

Advantageous Effects

According to a method for estimating a state of charge of an energy storage system according to an embodiment of the present invention, different state-of-charge (SOC) parameters are derived according to a charge/discharge state, and thus the degree of dependence on a voltage modeling technique is higher than the degree of dependence on a current integrating method, and the state of charge of the energy storage system may be more accurately estimated.

BRIEF DESCRIPTION OF THE DRAWINGS

FIG. 1 is a flowchart illustrating a method for estimating a state of charge (SOC) of an energy storage system (ESS) according to an embodiment of the present invention.

FIG. 2 is a graph illustrating a maximum error ratio of a state of charge (SOC) to which an embodiment of the present invention is applied and a maximum error ratio of a state of charge (SOC) to which a convention estimation method is applied, in relation to a current amount.

FIG. 3 is a flowchart illustrating a method for estimating a state of charge (SOC) of an energy storage system (ESS) according to a second embodiment of the present invention.

FIG. 4 is a flowchart illustrating a state-of-charge (SOC) estimation step of the method for estimating a state of charge (SOC) of an energy storage system (ESS) according to the second embodiment of the present invention.

FIG. 5 is a configuration diagram illustrating a device for estimating a state of charge (SOC) of an energy storage system (ESS) according to an embodiment of the present invention.

FIG. 6 is a configuration diagram illustrating a SOC estimation unit in the device for estimating a state of charge (SOC) of an energy storage system (ESS) according to an embodiment of the present invention.

MODE FOR CARRYING OUT THE INVENTION

Hereinafter, embodiments of the present invention will be described in detail with reference to the accompanying drawings. However, the present invention is not restricted or limited by the embodiments. Rather, the embodiments are provided so that the disclosure of the present invention is thorough and complete and fully conveys the scope of the present invention to those skilled in the art.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present disclosure.

Embodiment 1

Next, a method for estimating a state of charge (SOC) of an energy storage system (ESS) according to an embodiment of the present invention will be described.

According to the method for estimating a state of charge (SOC) of an energy storage system (ESS) of the present invention, different state-of-charge (SOC) parameters are derived according to a charge/discharge state, so that an accurate state of charge (SOC) may be estimated on the basis of the derived state-of-charge (SOC) parameters.

FIG. 1 is a flowchart illustrating the method for estimating a state of charge (SOC) of an energy storage system (ESS) according to an embodiment of the present invention.

Referring to FIG. 1, according to the method for estimating a state of charge (SOC) of an energy storage system (ESS) according to an embodiment of the present invention, a current, voltage, and temperature of the energy storage system (ESS) are measured (a first step, hereinafter referred to as a state measurement step S110), and it is determined whether the energy storage system (ESS) is in a charge state or a discharge state (a second step, hereinafter referred to as a charge/discharge determination step S120).

Thereafter, a state-of-charge (SOC) parameter is derived on the basis of the charge state or discharge state determined in the charge/discharge determination step S120 (a third step, hereinafter referred to as a parameter deriving step S130), and the state of charge (SOC) is estimated on the basis of the derived state-of-charge (SOC) parameter (a fourth step, hereinafter referred to as a state-of-charge (SOC) estimation step S140).

Furthermore, all of the above-mentioned steps are repeated at a predetermined estimation period, to estimate an accurate state of charge (SOC). Here, the predetermined estimation period may be set to, for example, 30 seconds, but is not limited thereto.

Each step of the method for estimating a state of charge (SOC) of an energy storage system (ESS) is described in more detail below.

In the state measurement step S110, the current, voltage, and temperature of the energy storage system (ESS) are measured, and in more detail, the current, voltage, and temperature of a battery rack in the energy storage system (ESS) are measured.

A typical energy storage system (ESS) is provided with a plurality of battery racks, and such a battery rack is formed by stacking in layers battery modules configured with a plurality of battery cells.

A current, voltage, and temperature measured in each battery cell are collected by a battery module, and the collected current, voltage, and temperature of each battery module are transmitted to a battery rack and then are collected to calculate the current, voltage, and temperature of the battery rack.

Furthermore, the estimation period is changed according to the state of charge (SOC). Here, in general, an error of estimation of the state of charge (SOC) increases in a low state of charge (SOC) and in a high state of charge (SOC).

Therefore, the period is changed so that the state of charge (SOC) is estimated in units of 1% for the state of charge (SOC) of 0-10 or 90-100% and is estimated in units of 20% for the state of charge (SOC) of 10-90%, thereby estimating a value efficiently and accurately.

Furthermore, in the charge/discharge determination step (S120), the charge/discharge state is determined on the basis of the current and voltage measured in the state measurement step S110.

In general, discrimination between the charge state and the discharge state is determined by a polarization voltage in a battery, and a polarity of the polarization voltage is determined by a value accumulated according to a current direction.

When a current has a discharge (−) polarity, (−) values are accumulated to the polarization voltage, and when the current has a charge (+) polarity, (+) values are accumulated to the polarization voltage.

Furthermore, when there is no current flow, a value of the polarization voltage converges to 0.

When the value of the polarization voltage becomes 0, the state of charge (SOC) is maintained at an immediately previous final polarity.

Therefore, when the discrimination between the charge state and the discharge state is simply determined according to a current direction of the current, an internal state of a battery cannot be sufficiently reflected.

For example, when a discharge is performed with a current of 2 A for four seconds after charging with a current of 8 A for 15 minutes, the final direction of the current indicates a discharge, but the internal state of the battery is closer to a charge state.

Therefore, the charge state and the discharge state of the battery may be determined in consideration of a magnitude and duration time of a current that flows for a predetermined time.

Furthermore, in the parameter deriving step S130, a parameter is derived according to the charge state or the discharge state determined in the charge/discharge determination step S120.

The parameter is a variable representing characteristics of an R-C circuit. In general, since a battery is a material having chemical characteristics, in order to analyze the battery, an R-C circuit having the same characteristics as the battery is configured, and the circuit is analyzed to detect the performance of the battery.

Modeling by using the R-C circuit represents that a circuit which simply includes a resistor and a capacitor is configured to express the characteristics of a battery since analysis becomes more difficult as a circuit is more complicated.

Furthermore, a battery model in which a battery is modeled with an R-C circuit stores information about an internal component value of the R-C circuit which varies with a temperature and state of charge (SOC).

Therefore, the R-C circuit includes an internal resistance component R0 which is a most fundamental element and polarization components R1 and C1 which vary with a temperature and state of charge (SOC), and these components are referred to as parameters and are expressed as (equation 1).

(Equation 1)

$$V'_1(t) = -\frac{1}{R_1 C_1} V_1(t) - \frac{1}{C_1} i(t) + \frac{1}{C_1} w_1(t) \qquad ①$$

$$V_1(t) = V_1 - R_0 i(t) + v(t) \qquad ②$$

Where Vt(t) and i(t) denote a voltage and a current measured in the R-C circuit at a time t, V1 denotes a polarization voltage, and v(t) denotes a value for compensating for a measurement error.

Furthermore, a state variable equation defined by a first-order differential relationship of V1(t) represents a voltage on an RC stage at a time t (i.e., V1(t) represents a voltage on R1 and C1 stage), and w1(t) denotes a value for compensating for a measurement error.

Meanwhile, the state-of-charge (SOC) parameters are configured as a table of each parameter value (internal component value/(internal resistor R0, resistor R1, capacitor C1)) updated by a temperature and state of charge (SOC), so that each parameter value is derived using a measured temperature and the state of charge (SOC) estimated during a previous estimation period.

Furthermore, the state-of-charge (SOC) parameter table may be separately configured according to a charge state and a discharge state, so as to improve the accuracy that decreased at the time of charge/discharge.

If a current estimation period is a first estimation period, the state of charge (SOC) is firstly estimated using a current integrating method, and a previously estimated state of charge (SOC) is set to the state of charge (SOC) of a previous estimation period.

Furthermore, in the state-of-charge (SOC) estimation step S140, the state of charge (SOC) of the energy storage system is estimated on the basis of the state-of-charge (SOC) parameters derived in the parameter deriving step S130.

In an embodiment of the present invention, a voltage modeling technique is used to estimate the state of charge (SOC). Therefore, since an open circuit voltage (OCV) and the state of charge (SOC) have an excellent linear relationship, the state of charge (SOC) may be easily estimated using a table representing the relationship.

However, since the open circuit voltage (OCV) is a voltage when a discharge or charge is not performed (when a current is not applied), a voltage between a positive electrode and a negative electrode should be measured after elapse of dozens of minutes or several hours after a charge or discharge is performed.

Therefore, the open circuit voltage (OCV) is calculated by subtracting a polarization voltage generated during the charge/discharge and a dropped voltage due to internal component values from a voltage measured in a battery pack, and is expressed as (equation 2).

Open circuit voltage (OCV)=battery pack voltage−
polarization voltage−dropped voltage    (Equation 2)

Here, the polarization voltage and the enhanced voltage are calculated by plugging, in equation 1, the state-of-charge (SOC) parameters derived in the parameter deriving step (S130).

Furthermore, the state of charge (SOC) may be easily derived by matching the calculated open circuit voltage (OCV) to the relational table between state of charge (SOC) and open circuit voltage (OCV).

The state of charge (SOC) calculated using different parameters according to a charge/discharge state as described above has a reduced error ratio in comparison with a conventional state of charge (SOC), as illustrated in FIG. 2.

FIG. 2 is a graph illustrating a maximum error ratio of the state of charge (SOC) to which an embodiment of the present invention is applied and a maximum error ratio of the state of charge (SOC) to which a convention estimation method is applied, in relation to a current amount.

Referring to FIG. 2, the dotted line represents the error ratio of the state of charge (SOC) calculated using a constant state-of-charge (SOC) parameter without considering a charge/discharge state according to a current magnitude.

Furthermore, the solid line represents the error ratio of the state of charge (SOC) calculated using different state-of-charge (SOC) parameters according to a charge state or a discharge state. It may be confirmed that the error ratio of the solid line is significantly low than that of the dotted line.

Embodiment 2

Next, a method for estimating a state of charge (SOC) of an energy storage system (ESS) according to a second embodiment of the present invention will be described.

According to the method for estimating a state of charge (SOC) of an energy storage system (ESS) of the present invention, an accurate state of charge (SOC) may be estimated by changing a weight according to an error range between states of charge (SOCs) estimated on the basis of the current integrating method and the voltage modeling technique.

FIG. 3 is a flowchart illustrating the method for estimating a state of charge (SOC) of an energy storage system (ESS) according to the second embodiment of the present invention.

Referring to FIG. 3, according to a battery cell manufacturing method according to the second embodiment of the present invention, a current, voltage, and temperature of the energy storage system are measured (a state measurement step S310), and each state of charge (SOC) is estimated using the measured current, voltage, and temperature, the current integrating method, and the voltage modeling technique (a state-of-charge (SOC) estimation step S320).

Thereafter, a difference between the state of charge of the current integrating method and the state of charge of the voltage modeling technique estimated in the state-of-charge (SOC) estimation step S320 is compared with a predetermined error range to determine whether the difference exceeds the predetermined error range (an error range comparison step S330), and when the difference between the state of charge (SOC) of the current integrating method and the state of charge (SOC) of the voltage modeling technique exceeds the predetermined error range, a predetermined weight is applied to the state of charge of the current integrating method and the state of charge of the voltage modeling technique to calculate a final state of charge (SOC) (a final state-of-charge (SOC) calculation step S340).

Each step of the method for estimating a state of charge (SOC) of an energy storage system (ESS) is described in more detail below.

In the state measurement step S110, the current, voltage, and temperature of the energy storage system (ESS) are measured, and in more detail, the current, voltage, and temperature of a battery rack in the energy storage system (ESS) are measured.

A typical energy storage system (ESS) is provided with a plurality of battery racks, and such a battery rack is formed by stacking in layers battery modules configured with a plurality of battery cells.

A current, voltage, and temperature measured in each battery cell are collected by a battery module, and the collected current, voltage, and temperature of each battery module are transmitted to a battery rack and then are collected to derive the current, voltage, and temperature of the battery rack.

Furthermore, all of the above-mentioned steps are repeated at a predetermined estimation period, to estimate an accurate state of charge (SOC). Here, the predetermined estimation period may be set to, for example, 30 seconds, but is not limited thereto.

Furthermore, the estimation period is changed according to the state of charge (SOC). Here, in general, an error of estimation of the state of charge (SOC) increases in a low state of charge (SOC) and in a high state of charge (SOC).

Therefore, the period is changed so that the state of charge (SOC) is estimated in units of 1% for the state of charge (SOC) of 0-10 or 90-100% and is estimated in units of 20% for the state of charge (SOC) of 10-90%, thereby estimating a value efficiently and accurately.

Furthermore, in the state-of-charge (SOC) estimation step S320, each state of charge (SOC) is estimated using the current, voltage, and temperature measured in the state measurement step S310, the current integrating method, and the voltage modeling technique.

The state-of-charge (SOC) estimation step S320 is described in more detail below with reference to FIG. 4.

FIG. 4 is a flowchart illustrating the state-of-charge (SOC) estimation step of the method for estimating a state of charge (SOC) of an energy storage system (ESS) according to the second embodiment of the present invention.

In the state-of-charge (SOC) estimation step S320, the state of charge (SOC) of the energy storage system is estimated by applying the current measured in the state measurement step S310 to the current integrating method (a current state-of-charge (SOC) estimation step S321), and the state of charge (SOC) of the energy storage system is estimated by applying the current, voltage, and temperature measured in the state measurement step S320 to the voltage modeling technique (a voltage state-of-charge (SOC) estimation step S322).

In detail, the current state-of-charge (SOC) estimation step S321 is a method for estimating the state of charge (SOC) of an energy storage system using the current integrating method, and in this step, the state of charge (SOC) is estimated on the basis of the current measured in the state measurement step S320.

The current integrating method has a simple algorithm since estimation is performed only using a current, and the state of charge (SOC) may be quickly estimated using this method, which is expressed as (equation 3).

$$SOC = SOC\_i - (\int i\, dt)/(\text{Nominal Capacity}) \quad \text{(Equation 3)}$$

Where SOC_i denotes the state of charge (SOC) of a previous estimation period, Nominal Capacity which is a nominal capacity denotes the amount of current that may be used normally at room temperature, and $\int i\, dt$ denotes the amount of current integrated for a predetermined time.

The voltage state-of-charge (SOC) estimation step S322 is a method for estimating the state of charge (SOC) of an energy storage system by applying the voltage modeling technique, and in this step, the state of charge (SOC) is estimated on the basis of the current, voltage, and temperature measured in the state measurement step S320.

Furthermore, according to the voltage modeling technique, the state of charge (SOC) is estimated on the basis of an open circuit voltage (OCV), and thus the accuracy is reduced at the time of charge/discharge. Here, the open circuit voltage (OCV) represents a voltage when a charge or discharge is not performed (when a current is not applied).

To address this issue, different state-of-charge (SOC) parameters are formatted in a table according to a charge state and a discharge state so that the state of charge (SOC) may be estimated according to each state.

To describe the voltage state-of-charge (SOC) estimation step S322 in more detail, it is determined whether a battery is in a charge state or a discharge state, and the state-of-charge (SOC) parameter is derived on the basis of the temperature measured in the state measurement step S310 and the state of charge (SOC) measured in a previous measurement period.

Here, the state-of-charge (SOC) parameter has different values according to a battery charge/discharge state.

The polarization voltage and dropped voltage required for equation 2 may be calculated by plugging the parameter derived according to a battery state in equation 1.

The state of charge (SOC) may be easily derived by calculating the open circuit voltage (OCV) through equation 2 and matching the calculated open circuit voltage (OCV) to a table between state of charge (SOC) and open circuit voltage (OCV).

In the error range comparison step S330, the difference between the state of charge (SOC) of the current integrating method and the state of charge (SOC) of the voltage modeling technique estimated in the state-of-charge (SOC) estimation step S320 is compared with the predetermined error range to determine whether the difference exceeds the predetermined error range.

This is because the accuracy of the state of charge (SOC) reduces since an error ratio of a current sensor which has a higher error ratio than that of a voltage sensor is accumulated since the current state of charge (SOC) estimated in the current state-of-charge (SOC) estimation step (S321) is estimated on the basis of the state of charge (SOC) calculated in a previous estimation period, and is estimated only on the basis of a current value measured in the current sensor.

Therefore, the difference between the state of charge (SOC) of the voltage modeling technique having a relatively low error ratio as time passes and the state of charge (SOC) of the current integrating method having an error ratio that increase as time passes is calculated and compared with the predetermined range to determine whether the difference exceeds the predetermined range.

Here, it is desirable to set the predetermined range to a value which is two or three times an error range that typically occurs.

Furthermore, the error range comparison step S330 may further include an estimation number-of-times comparison step in which the current state-of-charge (SOC) estimation step is compared with a predetermined number of times of estimation to determine whether the current state-of-charge (SOC) estimation step exceeds the predetermined number of times of estimation, so as to prevent a problem that occurs due to a temporary error.

Therefore, when the current state-of-charge (SOC) estimation step exceeds the predetermined number of times of estimation, the final state-of-charge (SOC) calculation step may be performed, and when the current state-of-charge (SOC) estimation step is less than the predetermined number of times of estimation, it is assumed that a temporary error has occurred, and the state measurement step S310 is performed again.

Here, in general, the predetermined number of times of estimation has an increased error value when the current integrating method is used, which means that the reliability of the state of charge (SOC) estimated using the current integrating method significantly decreases.

Furthermore, when the difference between the state of charge (SOC) of the current integrating method and the state of charge (SOC) of the voltage modeling technique exceeds the predetermined error range in the error range comparison step S330, a predetermined weight is applied to the state of charge of the current integrating method and the state of charge of the voltage modeling technique to calculate the final state of charge (SOC) in the final state-of-charge (SOC) calculation step S340.

For example, when an initial ratio between the state of charge (SOC) of the current integrating method and the state of charge (SOC) of the voltage modeling technique is 2:1, the ratio is changed to 1:4 so that the weight for the state of charge (SOC) of the current integrating method is calculated as ⅕, and the weight for the state of charge (SOC) of the voltage modeling technique is calculated as ⅘.

Therefore, when the state of charge (SOC) of the current integrating method is 90%, and the state of charge (SOC) of the voltage modeling technique is 60%, the final SOC (%)=90*(⅕)+(60)*(⅘), and thus the final state of charge (SOC) is calculated as 66%.

That is, since the voltage modeling technique also causes an error, the ratio of the state of charge (SOC) of the current integrating method is adjusted to accurately calculate the state of charge (SOC).

Embodiment 3

Next, a device for estimating a state of charge (SOC) of an energy storage system (ESS) according to an embodiment of the present invention will be described.

According to the device for estimating a state of charge (SOC) of an energy storage system (ESS) of the present invention, the state of charge (SOC) may be accurately calculated even regardless of passage of time by accurately estimating the state of charge (SOC) according to a charge or discharge state using the voltage modeling technique.

FIG. 5 is a configuration diagram illustrating the device for estimating a state of charge (SOC) of an energy storage system (ESS) according to an embodiment of the present invention.

Referring to FIG. 5, a device 100 for estimating a state of charge (SOC) of an energy storage system (ESS) according to an embodiment of the present invention includes: a state measurement unit 200 which measures a current, voltage, and temperature of the energy storage system (ESS); a state-of-charge (SOC) estimation unit 300 which estimates each state of charge (SOC) through the current integrating method and the voltage modeling technique on the basis of the current, voltage, and temperature measured in the state measurement unit 200; an error range comparison unit 400 which compares a difference between the state of charge (SOC) of the current integrating method and the state of charge (SOC) of the voltage modeling technique estimated in the state-of-charge (SOC) estimation unit 300 with a predetermined error range to determine whether the difference exceeds the predetermined error range; a final state-of-charge (SOC) calculation unit 500 which, when the difference between the state of charge of the current integrating method and the state of charge of the voltage modeling technique is determined to exceed the predetermined error range in the error range comparison unit 400, applies a predetermined weight to the state of charge of the current integrating method and the state of charge of the voltage modeling technique to calculate a final state of charge (SOC); and a memory 600 which stores each state of charge (SOC) estimated in the state-of-charge (SOC) estimation unit 300.

The device 100 for estimating a state of charge (SOC) of an energy storage system (ESS) may be configured inside or outside a battery BMS.

Each element of the device for estimating a state of charge (SOC) of an energy storage system (ESS) is described in more detail below.

The state measurement unit 200 measures the current, voltage, and temperature of the energy storage system (ESS).

In detail, the state measurement unit 200 instructs each battery cell to measure a current, voltage, and temperature through a temperature sensor, and performs a control so that the measured current, voltage, and temperature of each battery cell are collected and transmitted.

Furthermore, the state measurement unit 200 performs at a predetermined estimation period, and this period is changed according to the state of charge (SOC).

In general, an error of estimation of the state of charge (SOC) increases in a low state of charge (SOC) and in a high state of charge (SOC). Therefore, for example, the estimation period is changed so that the state of charge (SOC) is estimated in units of 1% for the state of charge (SOC) of 0-10 or 90-100%.

Furthermore, the estimation period is changed so that the state of charge (SOC) is estimated in units of 20% for the state of charge (SOC) of 10-90%, thereby estimating a value efficiently and accurately.

The state-of-charge (SOC) estimation unit 300 estimates each state of charge (SOC) in which the current, voltage, and temperature measured in the state measurement unit 200 are applied to the current integrating method and the voltage modeling technique.

The state-of-charge (SOC) estimation unit 300 is described in more detail below with reference to FIG. 6.

FIG. 6 is a configuration diagram illustrating the SOC estimation unit in the device for estimating a state of charge (SOC) of an energy storage system (ESS) according to an embodiment of the present invention.

Referring to FIG. 6, the state-of-charge (SOC) estimation unit 300 includes: a current integrating unit 310 which estimates the state of charge (SOC) of the energy storage system by applying the current measured in the state measurement unit 200 to the current integrating method; and a voltage modeling unit 320 which estimates the state of charge (SOC) of the energy storage system by applying the current, voltage, and temperature measured in the state measurement unit 200 to the voltage modeling technique.

Furthermore, since an algorithm of the current integrating method as expressed in equation 3 is pre-stored in the current integrating unit 310, the current integrating unit 310 estimates the state of charge (SOC) of the energy storage system on the basis of the current measured in the state measurement unit 200.

Furthermore, the estimated state of charge (SOC) is stored in the memory 600 so as to be used for a next estimation period and a first estimation period of the voltage modeling unit 320.

Furthermore, an algorithm of the voltage modeling technique as expressed in equation 1 and equation 2 is pre-stored in the voltage modeling unit 320, and the voltage modeling unit 320 estimates the state of charge (SOC) by applying the current, voltage, and temperature measured in the state measurement unit 200.

Referring to FIG. 6, the voltage modeling unit 320 includes: a charge/discharge determination unit 321 which determines whether a current state is a charge state or a discharge state on the basis of the current and voltage measured in the state measurement unit 200; a parameter deriving unit 322 which derives a state-of-charge (SOC) parameter on the basis of the state determined in the charge/discharge determination unit 321; and a voltage state-of-charge (SOC) estimation unit 323 (hereinafter referred to as a SOC estimation unit) which estimates the state of charge (SOC) of the energy storage system (ESS) on the basis of the state-of-charge (SOC) parameter derived in the parameter deriving unit 322.

In detail, the charge/discharge determination unit 321 accumulates a polarization voltage generated during a charge/discharge to determine whether the current state is the charge state or the discharge state according to a polarity of an accumulated value.

Furthermore, the parameter deriving unit 322 derives different state-of-charge (SOC) parameters according to a battery state determined in the charge/discharge determination unit 321 on the basis of the temperature measured in the state measurement unit 200 and the state of charge (SOC) estimated during a previous estimation period.

Here, the state-of-charge (SOC) parameter has different tables according to the charge state and the discharge state, so that an accurate state of charge (SOC) may be measured.

Here, the charge state and discharge state tables are pre-stored in the memory 600.

Furthermore, since the SOC estimation unit 323 includes the algorithm of equation 1 and equation 2, the SOC estimation unit 323 calculates the open circuit voltage (OCV) on the basis of the parameter derived in the parameter deriving unit 322, and may estimate the voltage state of charge (SOC) by matching the calculated open circuit voltage (OCV) to a relational table between state of charge (SOC) and open circuit voltage (OCV).

Here, the relational table between state of charge (SOC) and open circuit voltage (OCV) is pre-stored in the memory 600.

Furthermore, the error range comparison unit 400 compares the difference between the state of charge (SOC) of the current integrating method and the state of charge (SOC) of the voltage modeling technique estimated in the state-of-charge (SOC) estimation unit 300 with the predetermined error range to determine whether the difference exceeds the predetermined error range.

To this end, a SOC difference calculation unit is further included to calculate the difference between the state of charge (SOC) of the current integrating method and the state of charge (SOC) of the voltage modeling technique estimated in the state-of-charge (SOC) estimation unit 300.

Furthermore, an estimation number-of-times comparison unit is further included which compares the number of state-of-charge (SOC) estimations performed by the current integrating unit 310 with a predetermined number of times of estimation to determine whether the number of state-of-charge (SOC) estimations exceeds the predetermined number of times of estimation, thereby preventing adjustment of a state-of-charge (SOC) weight due to occurrence of a temporary error.

Furthermore, when the difference between the state of charge (SOC) of the current integrating method and the state of charge (SOC) of the voltage modeling technique is determined to exceed the predetermined error range in the error range comparison unit 400, the final state-of-charge (SOC) calculation unit 500 applies a predetermined weight to the state of charge of the current integrating method and the state of charge of the voltage modeling technique to calculate the final state of charge (SOC).

Since an algorithm for calculating a final state of charge (SOC) by applying a weight is pre-stored in the final state-of-charge (SOC) calculation unit 500, the final state-of-charge (SOC) calculation unit 500 changes the state of charge (SOC) estimated in the current integrating unit 310 and the state of charge (SOC) estimated in the voltage modeling unit 320 using a preset weight to calculate the final state of charge (SOC).

Furthermore, the memory 600 stores each state of charge (SOC) estimated in the state-of-charge (SOC) estimation unit 300, and stores in advance the charge state table and the discharge state table used by the parameter deriving unit 322.

Furthermore, the memory 600 stores in advance the relational table between state of charge (SOC) and open circuit voltage (OCV) used by the SOC estimation unit 323, and this table uses the same value regardless of the charge state or the discharge state of a battery.

That is, since voltage values related to the charge state and the discharge state are accumulated in the open circuit voltage (OCV), an average value of the charge state and the discharge state is used.

Although the technical concept of the present invention has been specifically described according to the above-mentioned embodiments, it should be noted that the above-mentioned embodiments are not for limiting the present invention but for describing the present invention. Furthermore, those skilled in the art can make various embodiments within the scope of the claims.

DESCRIPTION OF SYMBOLS

100: device for estimating a state of charge (SOC) of an energy storage system (ESS)
200: state measurement unit
300: a state-of-charge (SOC) estimation unit
310: current integrating unit
320: voltage modeling unit
321: charge/discharge determination unit
322: parameter deriving unit
323: state-of-charge (SOC) estimation unit 400: error range comparison unit
500: final state-of-charge (SOC) calculation unit
600: memory

What is claimed is:

1. A method for estimating a state of charge (SOC) of an energy storage system (ESS), the method comprising:
   a first step of measuring a current, voltage, and temperature of the energy storage system;
   a second step of determining a charge/discharge state on the basis of the current and voltage measured in the first step;
   a third step of deriving a state of charge (SOC) parameter according to the charge state or discharge state determined in the second step; and
   a fourth step of estimating the state of charge (SOC) of the energy storage system on the basis of the state of charge (SOC) parameter derived in the third step,
   wherein the third step of deriving the state of charge (SOC) parameter includes:
      modeling the energy storage system using an R-C circuit; and
      deriving the state of charge (SOC) parameter using the following equations:

$$V_1'(t) = -\frac{1}{R_1 C_1} V_1(t) - \frac{1}{C_1} i(t) + \frac{1}{C_1} w_1(t), \text{ and } V_1(t) = V_1 - R_0 i(t) + v(t),$$

and
   wherein R1 and C1 are polarization components, $w_1(t)$ is a value for compensating for a measurement error, $R_0$ is an internal resistance component of the energy storage system, i(t) is a current measured in the R-C circuit at a time (t), and $V_1$ denotes a polarization voltage, and v(t) is a value for compensating for a measurement error.

2. The method of claim 1, wherein the first step to the fourth step are repeated for a predetermined estimation period.

3. The method of claim 2, wherein in the third step of deriving the state of charge (SOC) parameter, the state of charge (SOC) parameter is further derived on the basis of the temperature measured in the first step and the state of charge (SOC) estimated during a previous estimation period.

4. The method of claim 3, wherein when the predetermined estimation period is a first estimation period, the state of charge (SOC) is estimated using a current integrating method and a previously estimated state of charge (SOC) is set to the state of charge (SOC) estimated during the previous estimation period.

5. The method of claim 2, wherein the predetermined estimation period is changed according to the state of charge (SOC).

6. A method for estimating a state of charge (SOC) of an energy storage system (ESS), the method comprising:
   a state measurement step of measuring a current, voltage, and temperature of the energy storage system;
   a state-of-charge (SOC) estimation step of estimating states of charge (SOCs) respectively based on a current integrating method and a voltage modeling technique by applying the current, voltage, and temperature measured in the state measurement step to the current integrating method and the voltage modeling technique;
   an error range comparison step of comparing a difference between the state of charge of the current integrating method and the state of charge of the voltage modeling technique estimated in the state-of-charge (SOC) estimation step to determine whether the difference exceeds a predetermined error range; and
   a final state-of-charge (SOC) calculation step of calculating, when the difference between the state of charge (SOC) of the current integrating method and the state of charge (SOC) of the voltage modeling technique in the error range comparison step, a final state of charge (SOC) by applying a predetermined weight to the state of charge of the current integrating method and the state of charge of the voltage modeling technique,
   wherein the applying the predetermined weight to the state of charge of the current integrating method and the state of charge of the voltage modeling technique includes:
      applying an initial ratio between the state of charge (SOC) of the current integrating method and the state of charge (SOC) of the voltage modeling technique; and
      adjusting the ratio between the state of charge (SOC) of the current integrating method and the state of charge (SOC) of the voltage modeling technique to the predetermined weight in response to the difference between the state of charge of the current integrating method and the state of charge of the voltage modeling technique exceeding the predetermined error range.

7. The method of claim 6, wherein the state-of-charge (SOC) estimation step comprises:
   a current state-of-charge (SOC) estimation step of estimating the state of charge (SOC) of the energy storage system by applying the current measured in the state measurement step to the current integrating method; and
   a voltage state-of-charge (SOC) estimation step of estimating the state of charge (SOC) of the energy storage system by applying the current, voltage, and temperature measured in the state measurement step to the voltage modeling technique.

8. The method of claim 6, wherein the error range comparison step comprises an estimation number-of-times comparison step of comparing a current state-of-charge (SOC) estimation step with a predetermined number of times of estimation to determine whether the current state-of-charge (SOC) estimation step exceeds the predetermined number of times of estimation,
   wherein when the current state-of-charge (SOC) estimation step exceeds the predetermined number of times of estimation, the final state-of-charge (SOC) calculation step is performed.

9. The method of claim 6, wherein the initial ratio between the state of charge (SOC) of the current integrating method and the state of charge (SOC) of the voltage modeling technique is 2:1.

10. A device for estimating a state of charge (SOC) of an energy storage system (ESS), the device comprising:
   a state measurement unit configured to measure a current, voltage, and temperature of the energy storage system;
   a state-of-charge (SOC) estimation unit configured to estimate states of charge (SOCs) respectively based on a current integrating method and a voltage modeling technique by applying the current, voltage, and temperature measured in the state measurement unit to the current integrating method and the voltage modeling technique;

an error range comparison unit configured to compare a difference between the state of charge (SOC) of the current integrating method and the state of charge (SOC) of the voltage modeling technique estimated in the state-of-charge (SOC) estimation unit to determine whether the difference exceeds a predetermined error range;

a final state-of-charge (SOC) calculation unit configured to calculate, when the difference between the state of charge of the current integrating method and the state of charge of the voltage modeling technique is determined to exceed the predetermined error range in the error range comparison unit, a final state of charge (SOC) by applying a predetermined weight to the state of charge of the current integrating method and the state of charge of the voltage modeling technique; and a memory configured to store each state of charge (SOC) estimated in the state-of-charge (SOC) estimation unit, wherein the applying the predetermined weight to the state of charge of the current integrating method and the state of charge of the voltage modeling technique includes:

applying an initial ratio between the state of charge (SOC) of the current integrating method and the state of charge (SOC) of the voltage modeling technique; and adjusting the ratio between the state of charge (SOC) of the current integrating method and the state of charge (SOC) of the voltage modeling technique to the predetermined weight in response to the difference between the state of charge of the current integrating method and the state of charge of the voltage modeling technique exceeding the predetermined error range.

11. The device of claim 10, wherein the state-of-charge (SOC) estimation unit comprises:

a current integrating unit configured to estimate the state of charge (SOC) of the energy storage system by applying the current measured in the state measurement unit to the current integrating method; and a voltage modeling unit configured to estimate the state of charge (SOC) of the energy storage system by applying the current, voltage, and temperature measured in the state measurement unit to the voltage modeling technique.

12. The device of claim 11, wherein the voltage modeling unit comprises:

a charge/discharge determination unit configured to determine whether a current state is a charge state or a discharge state on the basis of the current and voltage measured in the state measurement unit;

a parameter deriving unit configured to derive a state-of-charge (SOC) parameter on the basis of the state determined in the charge/discharge determination unit; and a voltage state-of-charge (SOC) estimation unit configured to estimate the state of charge (SOC) of the energy storage system (ESS) on the basis of the state-of-charge (SOC) parameter derived in the parameter deriving unit.

13. The device of claim 12, wherein the parameter deriving unit derives the state-of-charge (SOC) parameter on the basis of a temperature measured in a state measurement unit and the state of charge (SOC) stored in the memory and estimated during a previous estimation period.

14. The device of claim 10, wherein the error range comparison unit further comprises an estimation number-of-times comparison unit configured to compare the number of state-of-charge (SOC) estimations performed by the current integrating unit with a predetermined number of times of estimation to determine whether the number of state-of-charge (SOC) estimations exceeds the predetermined number of times of estimation.

15. The device of claim 10, wherein the initial ratio between the state of charge (SOC) of the current integrating method and the state of charge (SOC) of the voltage modeling technique is 2:1.

* * * * *